United States Patent
Kaiponen et al.

(10) Patent No.: US 7,054,671 B2
(45) Date of Patent: May 30, 2006

(54) ANTENNA ARRANGEMENT IN A MOBILE STATION

(75) Inventors: Teemu Kaiponen, San Diego, CA (US); Tero Kuittinen, Oulu (FI); Jari Kylmänen, Oulu (FI)

(73) Assignee: Nokia Mobile Phones, Ltd., Espoo (FI)

( * ) Notice: Subject to any disclaimer, the term of this patent is extended or adjusted under 35 U.S.C. 154(b) by 446 days.

(21) Appl. No.: 09/960,422

(22) Filed: Sep. 21, 2001

(65) Prior Publication Data

US 2002/0037757 A1   Mar. 28, 2002

(30) Foreign Application Priority Data

Sep. 27, 2000   (FI)   .................. 20002123

(51) Int. Cl.
*H04Q 7/20*   (2006.01)
(52) U.S. Cl. .................. 455/575.5; 455/575.7
(58) Field of Classification Search .......... 455/46, 455/63.1, 550.1, 575.5, 575.7, 90.3, 97, 193.1, 455/FOR. 232, FOR. 251; 343/700, 702, 343/720
See application file for complete search history.

(56) References Cited

U.S. PATENT DOCUMENTS

| | | | |
|---|---|---|---|
| 5,491,301 A * | 2/1996 | Akiba et al. .......... | 174/250 |
| 5,493,704 A | 2/1996 | Grangeat et al. ....... | 455/90 |
| 5,507,012 A | 4/1996 | Luxon et al. .......... | 455/89 |
| 5,530,919 A * | 6/1996 | Tsuru et al. .......... | 455/575.5 |
| 5,787,340 A | 7/1998 | Sepponen ............ | 455/90 |
| 5,945,954 A * | 8/1999 | Johnson ............. | 343/702 |
| 5,949,376 A * | 9/1999 | McDonald et al. .. | 343/700 MS |
| 5,982,335 A * | 11/1999 | Faraone et al. ....... | 343/787 |

(Continued)

FOREIGN PATENT DOCUMENTS

| | | |
|---|---|---|
| JP | 04220851 | 8/1992 |
| JP | 11136156 | 10/1997 |

(Continued)

OTHER PUBLICATIONS

"Reduction Of SAR In Human Head By Suppression Of Surface Currents Due To A Portable Telephone", Wang et al., IEICE Trans, Commun., vol. E80-B.
"Small Antennas" ISBN 086380 0483, pp. 116-137 and 138-165.
Japanese Patent document No. JP 2000101338.

*Primary Examiner*—Jean Gelin
(74) *Attorney, Agent, or Firm*—Perman & Green, LLP

(57) ABSTRACT

The invention concerns generally the technological field of antenna arrangements in mobile stations. The invention also concerns a mobile station equipped with such an antenna arrangement. One idea of the present invention is providing a planar antenna in which the printed wired board (PWB) of the mobile station is used. The planar antenna has preferably an air gap between the radiator element (216) and the ground plate (218). In order to reduce the effects of the RF fields to other phone electronics there is a sheet of low reluctance material (245) for reducing the RF fields. The sheet of low reluctance material is so located that it covers an area of the printed wired board which is not covered by the radiator element or the ground plane of the planar antenna. The low reluctance material is preferably ferrite material, such as flexible ferrite sheet, and it may be attached to the display unit (208a, 208b) or on the PWB (234).

22 Claims, 4 Drawing Sheets

U.S. PATENT DOCUMENTS

| | | | |
|---|---|---|---|
| 6,114,996 A * | 9/2000 | Nghiem | 343/700 MS |
| 6,121,931 A * | 9/2000 | Levi | 343/700 MS |
| 6,421,016 B1 * | 7/2002 | Phillips et al. | 343/702 |
| 6,531,985 B1 * | 3/2003 | Jones et al. | 343/702 |
| 6,580,397 B1 * | 6/2003 | Lindell | 343/702 |

FOREIGN PATENT DOCUMENTS

| | | |
|---|---|---|
| JP | 2000196282 | 7/2000 |
| WO | WO 97/17792 | 8/1997 |
| WO | WO 97/36380 | 10/1997 |

* cited by examiner

ANTENNA ARRANGEMENT IN A MOBILE STATION

TECHNICAL FIELD OF THE INVENTION

The invention concerns generally the technological field of antenna arrangements and EMC (ElectroMagnetic Compatibility) arrangements in mobile stations. Especially the invention concerns decreasing effects of RF radiation of the antenna in electronics of mobile stations. The invention also concerns a mobile station equipped with such an antenna arrangement.

BACKGROUND ART OF THE INVENTION

The evolution of smaller and smaller mobile telephones and other portable radio receivers and transceivers wirelessly communicating personal digital assistants has also promoted the need for antennas that do not protrude outside the smooth contours of the device. However, having the antenna inside the housing of the mobile station easily causes interference problems between the antenna and other electronics of the mobile station.

FIG. 1 illustrates a cross section of a typical mobile station according to the prior art. The mobile station 100 has a helix antenna 101 which is connected to the printed wired board 103 together with other electronics 102. The battery 105 of the mobile station forms a part of the housing 104. On the front side of the mobile station there is a microphone 106, keyboard 107, display unit 108 and earpiece 109.

Patent document [1] U.S. Pat. No. 5,787,340 discloses an arrangement where a shelding layer is located beside the user and an antenna. Such a shielding layer is illustrated in FIG. 1 as 120. A similar solution is also disclosed in article [2] "Reduction of SAR in Human Head by Suppression of Surface Currents due to a Portable Telephone" by J. Wang and O. Gujiwara, IEICE Trans. Commun., vol. E80-B, pp. 1810–1815. This article discloses an arrangement with low reluctance ferrite sheet disposed on the housing of a portable telephone. These prior art methods can be used also for reducing interference of RF fields to the handset. However, while the part of the RF radiation is absorbed with the additional shield, a portion of the RF intensity is lost, which means that the efficiency of the antenna may not be optimal. This problem is partially solved in a solution disclosed in patent document U.S. Pat. No. 5,507,012 where reflecting material is used in addition to an absorbing RF shield. This solution, however, is relatively complicated and therefore it is not well suited for mass production. A further disadvantage with these prior art solutions is their limitation to devices where the antenna is located outside the housing of the mobile station. Except the antenna, also the shield is visible and makes a negative effect on the appearance and usability of the mobile station. If the antenna would be placed inside the housing there could be interference problems between the antenna and other electronics of the device.

Patent document [3] U.S. Pat. No. 5,982,335 discloses a a microstrip antenna with a ground plane, microstrip radiator and a substrate disposed between the radiator and the ground plane. Theory of microstrip antennas is also described in [4] "Small Antennas" ISBN 086380 048 3, pages 138–165.

The arrangement described in U.S. Pat. No. 5,982,335 includes low magnetic reluctance material on the surface of the ground plane. The purpose of the low magnetic reluctance material is thus to influence the radiation pattern of the antenna. It would be possible to use this kind of microstrip antenna inside a mobile station, but there are certain drawbacks related with this prior art solution as well.

Firstly, the dielectric substrate of a microstrip antenna takes a lot of space within the housing of the mobile station, and therefore the size of the housing would become too large, or the space available for other electronics would become too small. Another drawback is the fact that while the antenna would be located just next to the electronics circuits, the radiation of the antenna could cause RF interference to the electronics. The low magnetic reluctance material on the surface of the ground plane affects the radiation pattern of the antenna by, for example, attenuating the radiation intensity in the direction opposite to the radiator. However, a microstrip antenna tends to cause high radiation intensity in small areas in the nearest surrounding area of the antenna.

A further drawback is related to the fact that it is difficult to connect a microstrip antenna to the RF electronics of a mobile station. The antenna element must first be equipped with connecting wires, next the printed wired board must and the antenna element must be installed within the housing, and finally the antenna wires must be soldered to the printed wired board. It is quite difficult to arrange these production phases within an automated production line, and thus manual assembly work may be required.

SUMMARY OF THE INVENTION

It is an object of the present invention to provide an antenna arrangement with which the disadvantages of prior art solutions would be reduced or avoided. It is especially an object of the present invention that an optimal electromagnetic compatibility would be achieved with an antenna structure and overall assembly that is applicable to large scale mass production of mobile stations.

One idea of the present invention is providing a planar antenna in which the PWB of the mobile station is used. The planar antenna has preferably an air gap between the radiator plate and the ground plane. In order to reduce the effects of the RF currents in phone circuitry there is also a sheet of low reluctance material for absorbing the RF radiation. The sheet of low reluctance material is so located that it covers an area of the printed wired board which is not covered by the radiator element or the ground plane of the planar antenna. Preferably the low reluctance material covers a high RF intensity area on the printed wired board. This means that the low reluctance material is placed on side of the planar antenna. The low reluctance material is also preferably located at least partly at the same area of the printed wired board as the display unit of the mobile station, such as between the display unit and the printed wired board. The low reluctance material is preferably ferromagnetic material, such as flexible sheet of ferromagnetic material, and it is may be attached to the display unit or on the PWB.

The present invention has several important advantages over the prior art solutions. With the present invention it is possible effectively reduce the interference of the antenna's RF radiation to other electronics of a mobile station, because the low reluctance material effectively reduces the RF currents on the surface of the printed wired board. The antenna arrangement also has a radiaton pattern that directs the radiation away from the user and thus makes the antenna efficiency high.

As the antenna is constructed above the printed wired board it is possible to use the antenna area of the PWB also for other electronic components and/or wiring. Therefore it is possible to make the size of the mobile station very small.

Many possibilities are available for attaching the ferromagnetic sheet to the display unit or the PWB, because the attachment means do not affect the performance of the antenna. Advantages can be achieved by locating the low reluctance material at least partly between the display unit and the printed wired board. The area of the display unit is relatively large and thereofire it is possible to place a ferromagnetic sheet with large area below the display unit. The wiring between the display unit and the PWB can be arranged to the edge of the display unit, and therefore the ferromagnetic sheet can be uniform. On the whole, the arrangement according to the present invention is extremely well suited for mass production, because all assembly phases can be provided on a single PWB assembly line.

The antenna arrangement of a mobile station according to the invention comprises
- a planar antenna including a ground plane and a planar radiator element which is disposed substantially parallel to the ground plane, and
- a printed wired board which is located substantially parallel to said ground plane and said radiator element, wherein the ground plane covers a first area on the printed wired board and the radiator element covers a second area on the printed wired board.

It is characterized in that
- the arrangement comprises a layer of low reluctance material which layer is substantially parallel to the printed wired board and covers a third area on the printed wired board, and
- said layer of low reluctance material is so located that the third area on the printed wired board is at least in part outside said first and second areas on the printed wired board.

The invention applies also to a mobile station, comprising:
- a planar antenna including a ground plane and a planar radiator element which is disposed substantially parallel to the ground plane, and
- a printed wired board which is substantially parallel to said ground plane and said radiator element, wherein the ground plane covers a first area on the printed wired board and the radiator element covers a second area on the printed wired board.

The invention is characterized in that
- the mobile station further comprises a layer of low reluctance material which layer is substantially parallel to the printed wired board and covers a third area on the printed wired board, and
- said layer of low reluctance material is so located that the third area on the printed wired board is at least in part outside said first and second areas of the printed wired board.

When an "area" covered on the printed wired board is referred in this context, the thickness of the printed wired board is disregarded.

BRIEF DESCRIPTION OF THE DRAWINGS

The novel features which are considered as characteristic of the invention are set forth in particular in the appended Claims. The invention itself, however, both as to its construction and its method of operation, together with additional objects and advantages thereof, will be best understood from the following description of specific embodiments when read in connection with the accompanying drawings.

DETAILED DESCRIPTION

Figure 1:
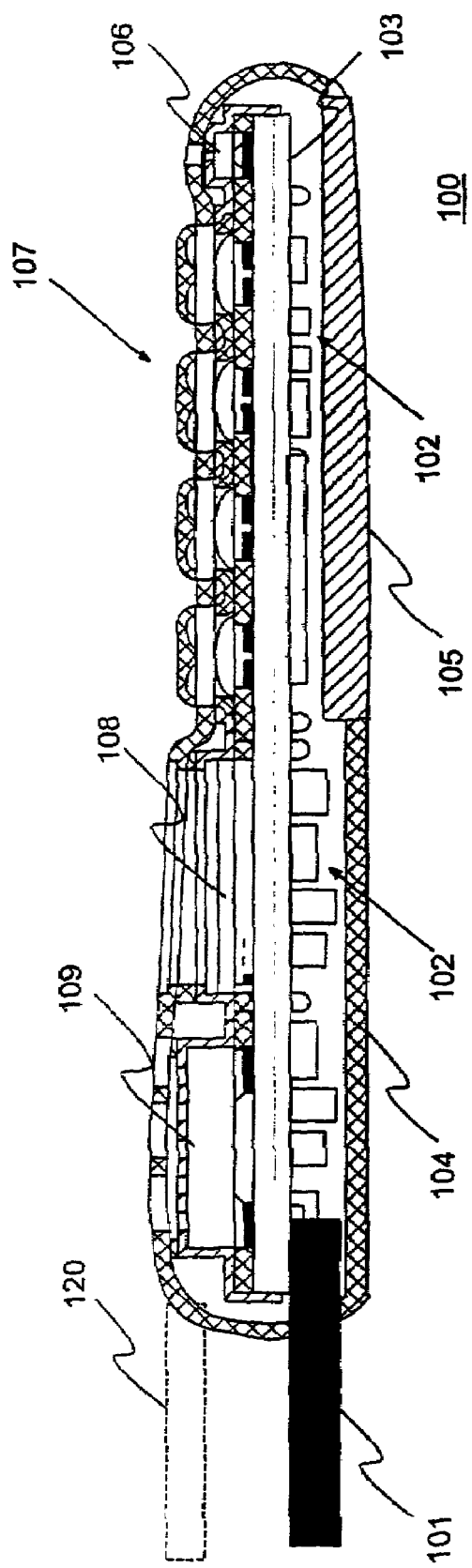
FIG. 1 illustrates an cross section view of a prior art mobile station.

FIG. 1 was already described in the prior art section above.

Figure 2:
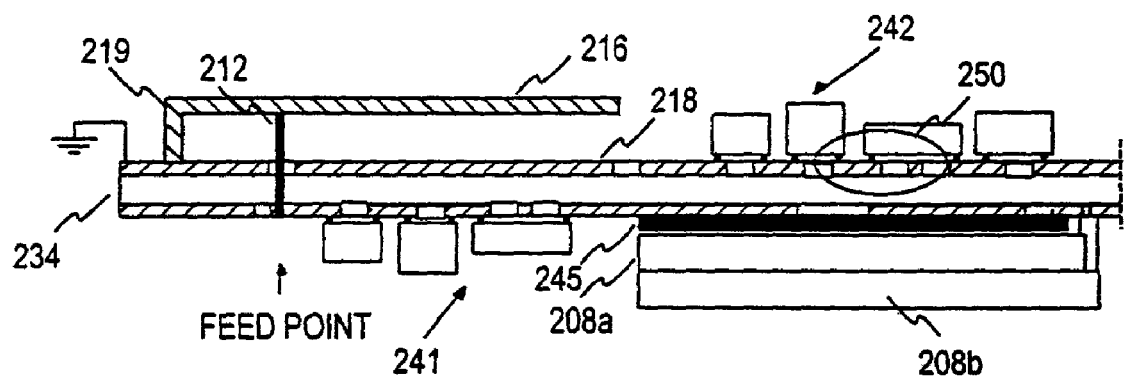
FIG. 2 illustrates an examplary antenna arrangement according to the invention.

FIG. 2 illustrates a cross section of an exemplary antenna arrangement according to the present invention. It comprises a ground plane 218 on a printed wired board 234, and a radiator element 216 which is connected to the ground plane from its edge, 219. The radiator element is substantially parallel with the ground plane and the printed wired board, and there is an air gap between the radiator element and the ground plate. The feed point of the radiator element is connected with a pin 212 to a printed wire of the PWB which is further connected to RF circuits 241 such as a duplex filter etc. In this arrangement ground plate and the radiator element of the planar antenna are located at the end of a printed wired board. Further details regarding planar inverted-L or -F antennas may be found in [5] "Small Antennas" ISBN 086380 048 3, pages 116–137.

According to the present invention there is a layer of low reluctance material 245 disposed in the printed wired board 234. The low reluctance material is, e.g. a sheet of ferromagnetic sheet. The low reluctance material is located further from the end of the printed wired board, between a display unit and the printed wired board. The display unit comprises a light guide or element with similar functionality 208a for providing illumination, and an LCD (Liquid Crystal Display) 208b. FIG. 2 also shows other electronics components 242 and an area 250 where the intensity of the RF currents would be relatively high if the low reluctance material 245 according to the present invention would not be applied.

Figure 3:
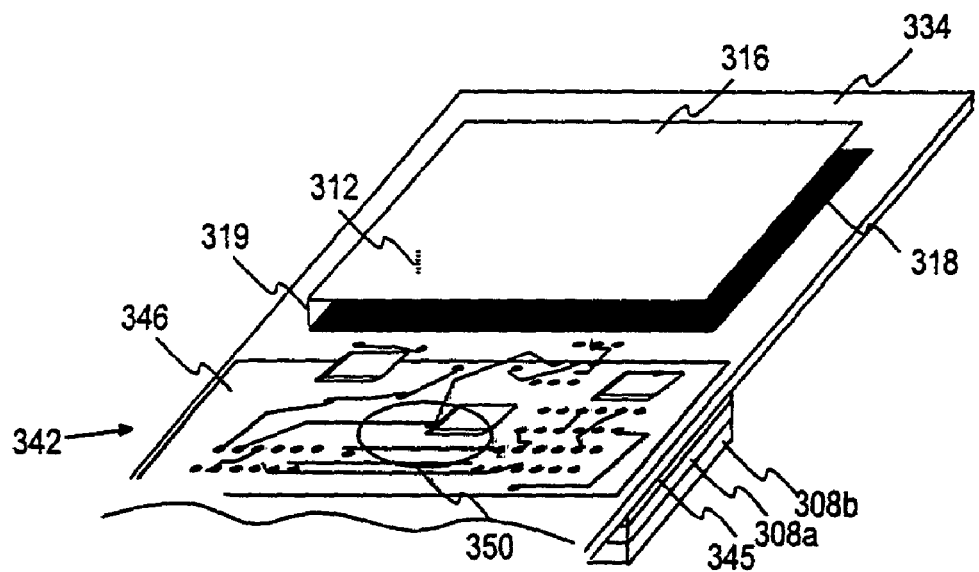
FIG. 3 illustrates a perspective view of an examplary antenna arrangement according to the invention.

FIG. 3 illustrates a perspective view of an examplary antenna arrangement according to the present invention. In this embodiment the radiator element 316 is connected to the ground plane 318 from its other edge 319. The FIG. 3 also shows the feed pin 312. The radiator element 316 covers the same area of the printed wired board as the ground plane 318. A ferromagnetic sheet 345 is applied on the other side of the printed wired board. The ferromagnetic sheet is located between the printed wired board 334 and a light guide 308a of the display unit which also includes an LCD 308b. The ferromagnetic sheet 345 covers an area 346 of the printed wired board. In this case, the area 346 does not overlap with the area 318. FIG. 3 shows an area 350 where the intensity of the RF radiation would be relatively high if the low reluctance material 345 according to the present invention would not be applied. FIG. 3 also illustrates some other electronics components 342 on the PWB.

Figure 4:
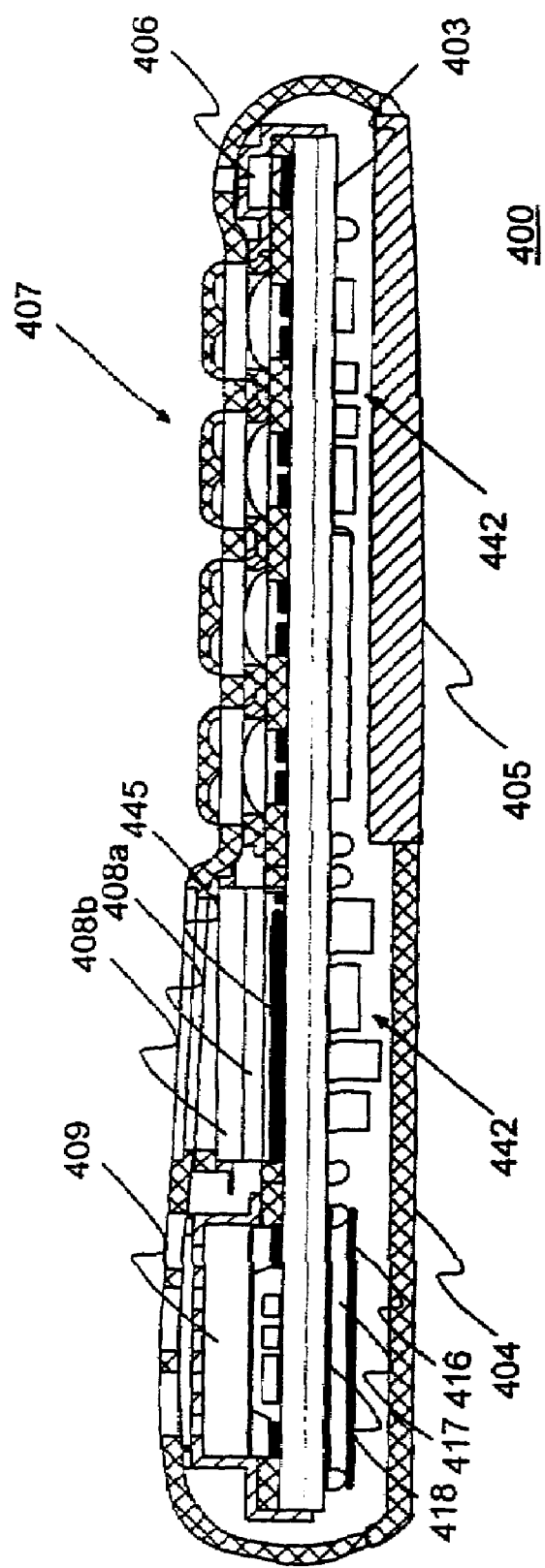
FIG. 4 illustrates a cross section view of a mobile station with an examplary antenna arrangement according to the invention.

FIG. 4 illustrates a cross section of an examplary mobile station which has an antenna arrangement according to the present invention. The antenna comprises a radiator element 416 and a ground plane 418 which is made of a metal layer of the PWB. There is an air gap 417 between the radiator element and the ground plate. According to the present invention there is a sheet of ferromagnetic material 445 on the other side of the PWB. The ferromagnetic sheet is located between the display unit and the PWB. The display unit consists of a light guide 408a and 408b.

FIG. 4 also shows the cover 404, the battery 405, the microphone 406, the keyboard 407 and the earpiece and other electronic components 442 of the mobile station. These parts of the mobile station are similar to the prior art solution as illustrated in FIG. 1.

Figure 5:
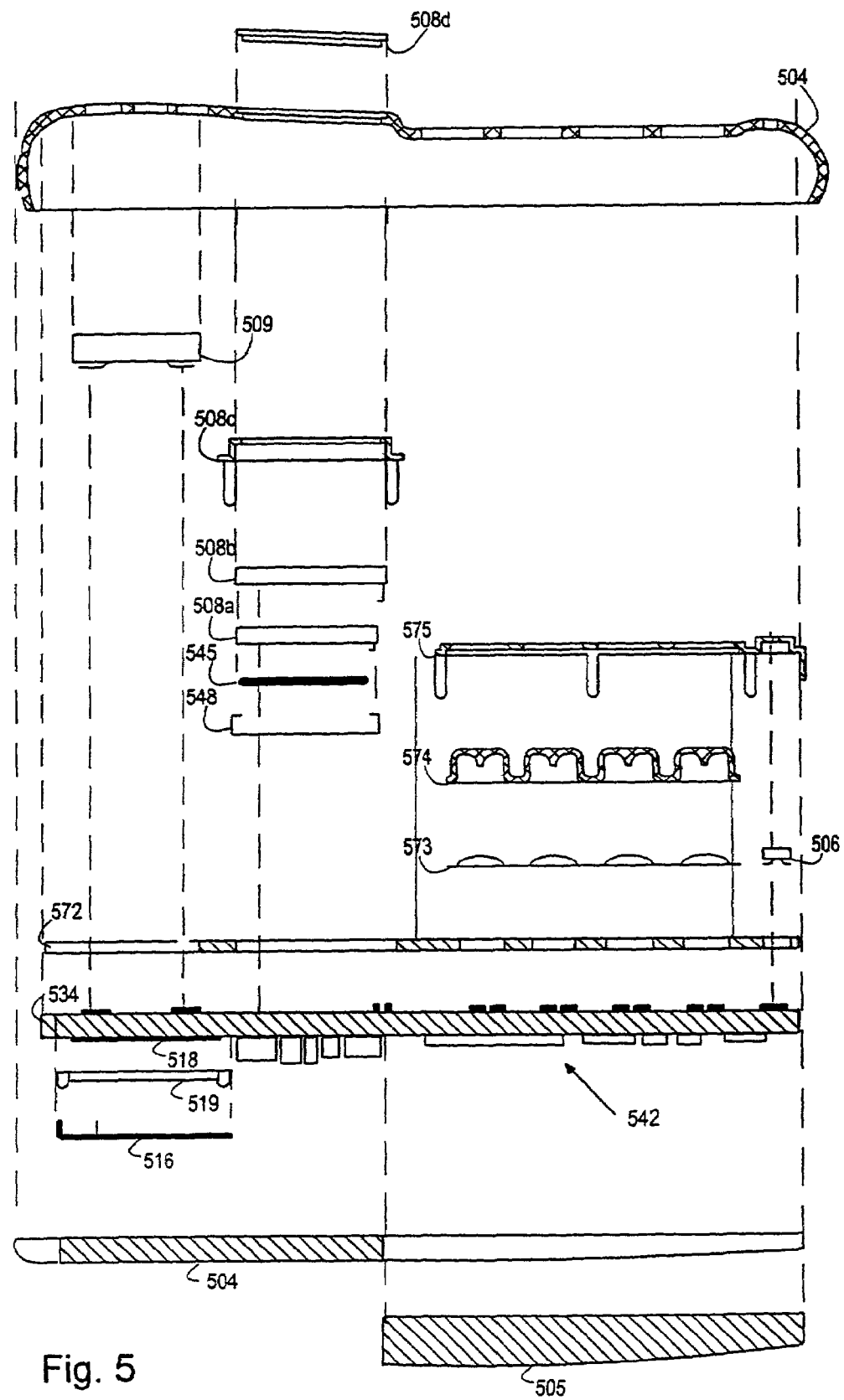
FIG. 5 illustrates an assembly diagram of an examplary mobile station according to the invention.

FIG. 5 illustrates an assembly diagram of an examplary mobile station according to the present invention. The planar antenna comprises a radiator 516 which is attached to the printed wired board with a plastic frame 519. The frame serves as a support and keeps the radiator element on a fixed distance from the ground plate 518.

The sheet of low reluctance material 545 is attached to the light guide 508a of the display unit using a clip 548. The clip keeps the sheet of eg. ferromagnetic sheet firmly in place. These parts are then attached to the printed wired board together with the LCD 508b by eg. using a frame 508c. There is also a transparent, protective window 508d above the display unit. Another possibility to attach the low reluctance material is attaching the sheet on the printed wired board by eg. gluing.

FIG. 5 also shows some other parts of the mobile station; keyboard 572–575, microphone 506, cover 504, battery 505 and other electronics components 542.

It is to be understood that the embodiments and variations shown and described herein are merely illustrative of the principles of this invention and that various modifications may be implemented by those skilled in the art without departing from the scope and spirit of the invention. Especially, it is to be understood that the present invention is not in any way restricted to the mentioned forms or assemblies of the illustrated devices. And even if the described embodiments have concerned a preferred embodiment of inverted-F antennas with an air gap, it is clear that the invention can be applied with any kind of planar antenna structures.

The invention claimed is:

1. An antenna arrangement of a mobile station, said arrangement comprising:
a planar antenna including a ground plane and a planar radiator element which is disposed substantially parallel to the ground plane with a space therebetween, and
a printed wired board which is located substantially parallel to said ground plane and said radiator element, wherein the ground plane covers a first area on the printed wired board and the radiator element covers a second area on the printed wired board,
wherein:
the arrangement comprises a layer of low reluctance material which layer is substantially parallel to the printed wired board and covers a third area on the printed wired board, which third area includes a number of components on a surface of the printed wire board,
said layer of low reluctance material is so located that the third area on the printed wired board is at least in part outside said first and second areas on the printed wired board, and
the space between the radiator element and the ground plane is substantially air, thus forming an air gap.

2. An antenna arrangement according to claim 1, characterized in that the low reluctance material covers a high intensity RF current area on the printed wired board for reducing the RF current intensity on said area.

3. An antenna arrangement according to claim 1, characterized in that the low reluctance material is flexible ferrite sheet.

4. An antenna arrangement according to claim 1, wherein the mobile station includes a display unit, characterized in that the layer of low reluctance material is located between the display unit and the printed wired board.

5. An antenna arrangement according to claim 4, characterized in that the display unit comprises a light guide, and said layer of low reluctance material is attached to said light guide.

6. An antenna arrangement according to claim 1, characterized in that said low reluctance material is attached to the ground plane.

7. An antenna arrangement according to claim 1, characterized in that the ground plane is formed of a conducting layer of the printed wired board.

8. An antenna arrangement according to claim 7, characterized in that said the ground plane is formed of the conductive layer of the printed wired board which is nearest to the radiator element.

9. An antenna arrangement according to claim 1, characterized in that the planar antenna is located at the end of the printed wired board, and the low reluctance material is located at a distance from said end of the printed wired board.

10. An antenna arrangement according to claim 1, characterized in that said printed wired board connects said planar antenna to other electronics of the mobile station.

11. A mobile station, comprising:
a planar antenna including a ground plane and a planar radiator element which is disposed substantially parallel to the ground plane with a space therebetween, and
a printed wired board which is substantially parallel to said ground plane and said radiator element, wherein the ground plane covers a first area on the printed wired board and the radiator element covers a second area on the printed wired board,
wherein:
the mobile station further comprises a layer of low reluctance material which layer is substantially parallel to the printed wired board and covers a third area on the printed wired board, which third area includes a number of components on a surface of the printed wire board,
said layer of low reluctance material is so located that the third area on the printed wired board is at least in part outside said first and second areas of the printed wired board, and
the space between the radiator element and the ground plane is substantially air, thus forming an air gap.

12. A mobile station according to claim 11, characterized in that the low reluctance material covers a high intensity RF current area on the printed wired board for reducing the RF current intensity on said area.

13. A mobile station according to claim 11, characterized in that the low reluctance material is flexible sheet of ferromagnetic material.

14. A mobile station according to claim 11, wherein the mobile station includes a display unit, characterized in that the layer of low reluctance material is located between the display unit and the printed wired board.

15. A mobile station according to claim 11, characterized in that the planar antenna is located at the end of the printed wired board, and the low reluctance material is located at a distance from said end of the printed wired board.

16. A mobile station according to claim 11, characterized in that said printed wired board connects said planar antenna to other electronics of the mobile station.

17. An antenna arrangement of a mobile station, said arrangement comprising:
a planar antenna including a ground plane and a planar radiator element which is disposed substantially parallel to the ground plane with a space therebetween, and
a printed wired board which is located substantially parallel to said ground plane and said radiator element, wherein the ground plane covers a first area on the printed wired board and the radiator element covers a second area on the printed wired board,
wherein:
the arrangement comprises a layer of low reluctance material which layer is substantially parallel to the printed wired board and covers a third area on the printed wired board,
said layer of low reluctance material is so located that the third area on the printed wired board is at least in part outside said first and second areas on the printed wired board and spans most of the width of the printed wired board.

18. A mobile station, comprising:
a planar antenna including a ground plane and a planar radiator element which is disposed substantially parallel to the ground plane with a space therebetween, and
a printed wired board which is substantially parallel to said ground plane and said radiator element, wherein the ground plane covers a first area on the printed wired board and the radiator element covers a second area on the printed wired board,
wherein:
the mobile station further comprises a layer of low reluctance material which layer is substantially parallel to the printed wired board and covers a third area on the printed wired board,
said layer of low reluctance material is so located that the third area on the printed wired board is at least in part outside said first and second areas of the printed wired board and spans most of the width of the printed wired board.

19. An antenna arrangement of a mobile station, said arrangement comprising:
a planar antenna including a ground plane and a planar radiator element which is disposed substantially parallel to the ground plane with a space therebetween, and
a printed wired board which is located substantially parallel to said ground plane and said radiator element, wherein the ground plane covers a first area on the printed wired board and the radiator element covers a second area on the printed wired board,
wherein:
the arrangement comprises a layer of low reluctance material which layer is substantially parallel to the printed wired board and covers a third area on the printed wired board,
said layer of low reluctance material is so located that the third area on the printed wired board is at least in part outside said first and second areas on the printed wired board and coincides with most of an area covered by a display attached to the printed wired board.

20. A mobile station, comprising:
a planar antenna including a ground plane and a planar radiator element which is disposed substantially parallel to the ground plane with a space therebetween, and
a printed wired board which is substantially parallel to said ground plane and said radiator element, wherein the ground plane covers a first area on the printed wired board and the radiator element covers a second area on the printed wired board,
wherein:
the mobile station further comprises a layer of low reluctance material which layer is substantially parallel to the printed wired board and covers a third area on the printed wired board,
said layer of low reluctance material is so located that the third area on the printed wired board is at least in part outside said first and second areas of the printed wired board and coincides with most of an area covered by a display attached to the printed wired board.

21. An antenna arrangement of a mobile station, said arrangement comprising:
a planar antenna including a ground plane and a planar radiator element which is disposed substantially parallel to the ground plane with a space therebetween, and
a printed wired board which is located substantially parallel to said ground plane and said radiator element, wherein the ground plane covers a first area on the printed wired board and the radiator element covers a second area on the printed wired board,
wherein:
the arrangement comprises a layer of low reluctance material which layer is substantially parallel to the printed wired board, covers a third area on the printed wired board and is located between a display attached to the printed wired board and the surface of the printed wired board to which the display is attached,
said layer of low reluctance is so located that the third area on the printed wired board is at least in part outside said first and second areas on the printed wired board.

22. A mobile station, comprising:
a planar antenna including a ground plane and a planar radiator element which is disposed substantially parallel to the ground plane with a space therebetween, and
a printed wired board which is substantially parallel to said ground plane and said radiator element, wherein the ground plane covers a first area on the printed wired board and the radiator element covers a second area on the printed wired board,
wherein:
the mobile station further comprises a layer of low reluctance material which layer is substantially parallel to the printed wired board, covers a third area on the printed wired board and is located between a display attached to the printed wired board and the surface of the printed wired board to which the display is attached,
said layer of low reluctance material is so located that the third area on the printed wired board is at least in part outside said first and second areas of the printed wired board.

* * * * *